United States Patent
Menendez-Nadal et al.

(10) Patent No.: US 10,797,676 B2
(45) Date of Patent: Oct. 6, 2020

(54) ACOUSTIC RESONATOR WITH ENHANCED BOUNDARY CONDITIONS

(71) Applicant: SnapTrack, Inc, San Diego, CA (US)

(72) Inventors: Oscar Menendez-Nadal, Altamonte Springs, FL (US); Thomas Bain Pollard, Longwood, FL (US); Brian Hal Fisher, Orlando, FL (US); Janardan Nath, Orlando, FL (US)

(73) Assignee: QUALCOMM Incorporated, San Diego, CA (US)

( * ) Notice: Subject to any disclaimer, the term of this patent is extended or adjusted under 35 U.S.C. 154(b) by 288 days.

(21) Appl. No.: 15/706,654

(22) Filed: Sep. 15, 2017

(65) Prior Publication Data

US 2019/0089326 A1    Mar. 21, 2019

(51) Int. Cl.
*H03H 9/02*      (2006.01)
*H03H 9/13*      (2006.01)
(Continued)

(52) U.S. Cl.
CPC .......... *H03H 9/02086* (2013.01); *H03H 3/02* (2013.01); *H03H 9/02118* (2013.01);
(Continued)

(58) Field of Classification Search
CPC .............. H03H 9/02086; H03H 9/131; H03H 9/02118; H03H 3/02; H03H 9/568; H03H 9/02228; H03H 9/54; H03H 9/13
(Continued)

(56) References Cited

U.S. PATENT DOCUMENTS

| 7,714,684 B2 | 5/2010 | Ruby et al. |
| 8,409,996 B2 | 4/2013 | Vanhelmont et al. |

(Continued)

FOREIGN PATENT DOCUMENTS

WO     2009133511 A1     11/2009

OTHER PUBLICATIONS

Kaitila J., "Review of Wave Propagation in BAW Thin Film Devices Progress and Prospects", IEEE Ultrasonics Symposium, 2007, pp. 120-129.

*Primary Examiner* — Robert J Pascal
*Assistant Examiner* — Jorge L Salazar, Jr.
(74) *Attorney, Agent, or Firm* — Colby Nipper

(57) ABSTRACT

Acoustic resonators with enhanced boundary conditions are disclosed. In an example aspect, a resonator includes a volume of piezoelectric material including an upper surface and a lower surface. The resonator also includes a bottom electrode extending along a portion of the lower surface of the volume of piezoelectric material. The resonator further includes a multi-layered top electrode extending along a portion of the upper surface of the volume of piezoelectric material. The multi-layered top electrode includes an active region including an interface layer of a first thickness, where the active region overlaps a portion of the bottom electrode. The multi-layered top electrode also includes a frame region including the interface layer of a second thickness, where the second thickness is greater than the first thickness. The multi-layered top electrode further includes an outer region including the interface layer of a third thickness, where the third thickness is less than the second thickness.

19 Claims, 9 Drawing Sheets

(51) Int. Cl.
- *H03H 3/02* (2006.01)
- *H03H 9/56* (2006.01)
- *H03H 9/54* (2006.01)

(52) U.S. Cl.
CPC .......... *H03H 9/02228* (2013.01); *H03H 9/13* (2013.01); *H03H 9/131* (2013.01); *H03H 9/54* (2013.01); *H03H 9/568* (2013.01)

(58) Field of Classification Search
USPC .................................. 333/133, 186, 187, 188
See application file for complete search history.

(56) References Cited

U.S. PATENT DOCUMENTS

| | | | |
|---|---|---|---|
| 2008/0143215 A1 | 6/2008 | Hara et al. | |
| 2015/0280687 A1* | 10/2015 | Burak | H03H 9/132 |
| | | | 310/321 |

* cited by examiner

ACOUSTIC RESONATOR WITH ENHANCED BOUNDARY CONDITIONS

TECHNICAL FIELD

This disclosure relates generally to acoustic resonators and, more specifically, bulk acoustic wave resonators.

BACKGROUND

Acoustic resonators (also called "acoustic filters") can be used for filtering high-frequency signal waves. Using a volume of piezoelectric material as a vibrating medium, acoustic resonators operate by transforming an electrical signal that is propagating along an electrical conductor into an acoustic signal that is propagating via the volume of piezoelectric material. The acoustic signal propagates at a velocity having a magnitude that is significantly less than that of the propagation velocity of the electrical signal. Generally, the magnitude of the propagation velocity of a signal wave is proportional to a size of a wavelength of the signal wave. Consequently, after transforming an electrical signal wave into an acoustic signal wave, the wavelength of the acoustic signal wave is significantly smaller. The resulting smaller wavelength of the acoustic signal wave enables filtering to be performed using a smaller filter device. This permits acoustic resonators to be used in electronic devices having size constraints, such as cellular phones and smart watches.

Bulk acoustic wave (also called "BAW" or "volume") resonators are a type of acoustic resonators manufactured in a sandwich construction. The sandwich construction includes a volume of piezoelectric material positioned between an overlap of two electrodes in an active region of the BAW resonator. One of the two electrodes is coupled to a terminal via an electrode feed to provide an input signal for filtering. After filtering the input signal through the volume of piezoelectric material, the other of the two electrodes communicates a filtered portion of the input signal as an output signal to another electrical component.

Operation of an ideal BAW resonator would cause the volume of piezoelectric material to operate in an optimum vertical vibration (also called a "piston mode"). However, in practice, operation of a typical, real-world BAW resonator causes propagation of lateral waves (also called "Rayleigh-Lamb modes"), which result in energy being lost by the BAW resonator. Lost energy results in a decrease of a magnitude (or "volume") of the filtered signal, and thus a decrease in the quality of the BAW resonator.

This background provides context for the disclosure. Unless otherwise indicated, material described in this section is not prior art to the claims in this disclosure and is not admitted to be prior art by inclusion in this section.

SUMMARY

Acoustic resonators with enhanced boundary conditions are disclosed herein. The boundary conditions can be enhanced by providing an outer region of a top electrode that causes a step-up or a step-down in cut-off frequency (a "step") from a frame region of the top electrode. This step between the frame region and the outer region of the top electrode reduces propagation of lateral waves into an active region of a volume of piezoelectric material via an outer region of the volume of piezoelectric material. To facilitate the step, the top electrode may include an outer region that is thinner (or less massive) than a frame region of the top electrode. The top electrode may further include a transition between the frame region and the outer region, where the transition is positioned above a portion of a bottom electrode.

In an example aspect, a resonator includes a volume of piezoelectric material including an upper surface and a lower surface. The resonator also includes a bottom electrode extending along a portion of the lower surface of the volume of piezoelectric material. The resonator further includes a multi-layered top electrode extending along a portion of the upper surface of the volume of piezoelectric material. The multi-layered top electrode includes an active region including a first portion of an interface layer having a first thickness. The active region overlaps a portion of the bottom electrode. The multi-layered top electrode also includes a frame region including a second portion of the interface layer having a second thickness. The second thickness is greater than the first thickness. The multi-layered top electrode further includes an outer region including a third portion of the interface layer having a third thickness. The third thickness is different from the second thickness.

In another example aspect, a resonator includes a volume of piezoelectric material including an upper surface and a lower surface. The resonator also includes a bottom electrode extending along a portion of the lower surface of the volume of piezoelectric material. The resonator further includes a multi-layered top electrode extending along a portion of the upper surface of the volume of piezoelectric material. The multi-layered top electrode includes an active region including a first portion of an interface layer having a first thickness and a first portion of an upper layer having a second thickness. The active region overlaps a portion of the bottom electrode. The multi-layered top electrode also includes a frame region including a second portion of the interface layer having a third thickness and a second portion of the upper layer having a fourth thickness. The third thickness is greater than the first thickness. The multi-layered top electrode further includes an outer region including a third portion of the interface layer having a fifth thickness and a third portion of the upper layer having a sixth thickness. The sixth thickness is less than the fourth thickness.

In another example aspect, a resonator includes a volume of piezoelectric material including an upper surface and a lower surface. The resonator also includes a bottom electrode extending along a portion of the lower surface of the volume of piezoelectric material. The resonator further includes a multi-layered top electrode extending along a portion of the upper surface of the volume of piezoelectric material. The multi-layered top electrode includes an active region including a first portion of an interface layer having a first thickness and a first portion of an upper layer having a second thickness. The active layer overlaps a portion of the bottom electrode. The multi-layered top electrode also includes a frame region including a second portion of the interface layer having a third thickness and a second portion of the upper layer having a fourth thickness. The third thickness is greater than the first thickness. The multi-layered top electrode further includes an outer region including a third portion of the interface layer having a fifth thickness and a third portion of the upper layer having a sixth thickness. The fifth thickness is less than the third thickness and the sixth thickness is less than the fourth thickness.

In an example method for filtering an electrical signal, the method includes receiving the electrical signal via a top electrode. The top electrode includes an outer region including a first portion of an interface layer, the first portion of the interface layer having a first thickness. The top electrode also includes a frame region including a second portion of the interface layer, the second portion of the interface layer having a second thickness. The second thickness is greater than the first thickness. The top electrode further includes an active region including a third portion of the interface layer, the third portion of the interface layer having a third thickness. The third thickness is less than the second thickness. The method also includes transforming, at a portion of a volume of piezoelectric material, the electrical signal into an acoustic signal. The portion of the volume of piezoelectric material is below the active region. The method further includes transforming, at a portion of a bottom electrode, a portion of the acoustic signal into a filtered electrical signal. The bottom electrode extends below the portion of the volume of piezoelectric material.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Overview

Figure 1:
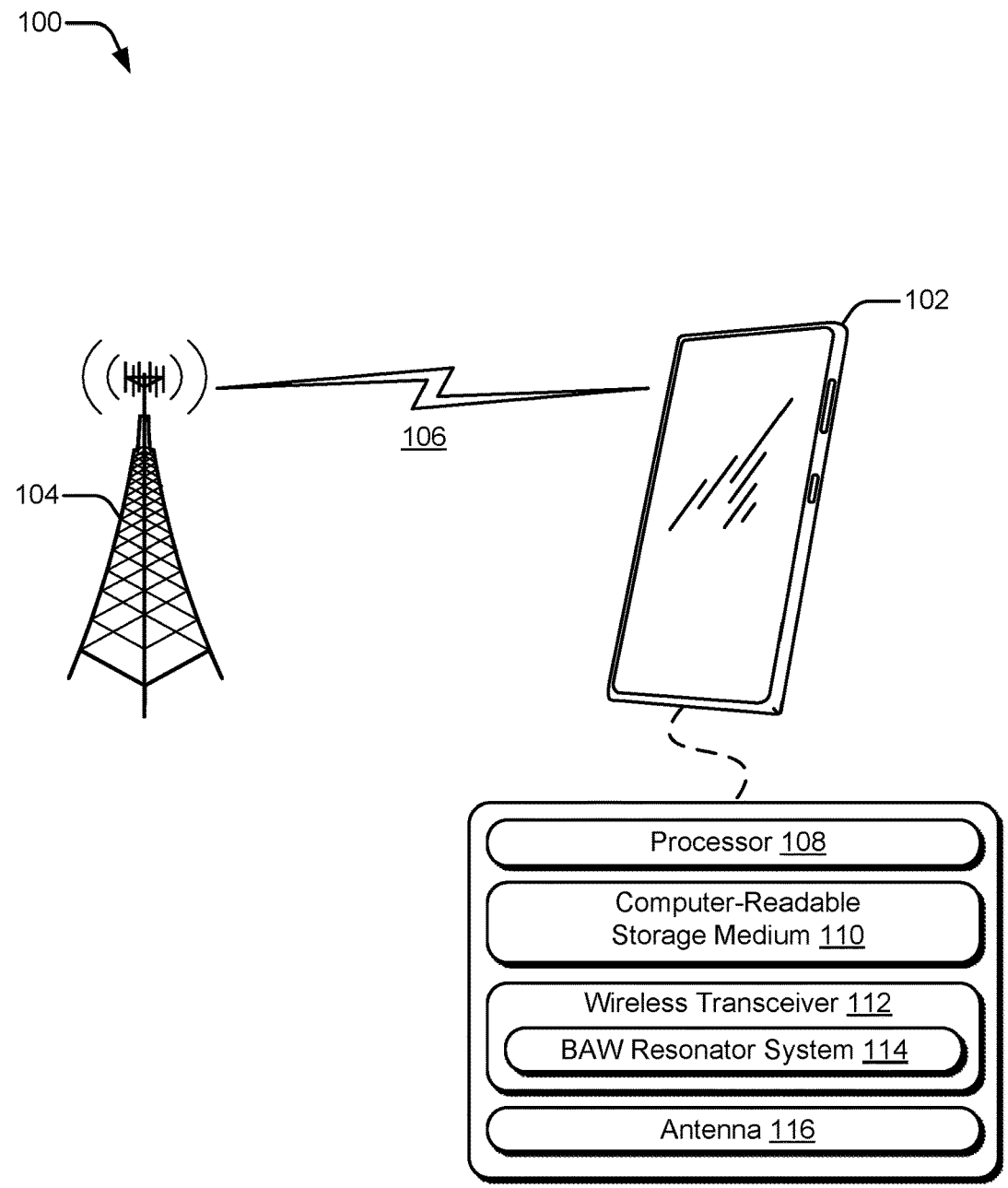
FIG. 1 is an illustration of an example environment for receiving and filtering a wireless signal using a resonator with enhanced boundary conditions according to one or more implementations.

Conventional techniques for reducing a loss of energy from lateral waves in a BAW resonator include modifying boundary conditions of an active region by providing a frame for mass loading. Mass-loading is used to vary a relative thickness of an electrode in a frame region immediately outside of the active region of the BAW resonator. The varied thickness of the electrode causes a step-up or a step-down in a cutoff frequency for waves traveling in a volume of piezoelectric material below the frame region. The step-up or the step-down in the cutoff frequency causes a reflection of lateral waves directed toward the volume of piezoelectric material of the frame region. However, mass loading is less-effective for reflecting lateral waves from the volume of piezoelectric material in an outer region of a top electrode because an electrode feed provides mass-loading from the frame through an outer region of the top electrode.

An example resonator with enhanced boundary conditions includes a multi-layered top electrode. The multi-layered top electrode includes an interface layer positioned between a current-carrying layer of the top electrode and a volume of piezoelectric material to provide an acoustic interface. The interface layer has a first thickness in an active region, a second thickness in a frame region, and a third thickness in an outer region. In implementations where the volume of piezoelectric material has Type I dispersion, the second thickness is less than both the first thickness and the third thickness. In implementations where the volume of piezoelectric material has Type II dispersion, the second thickness is greater than both the first thickness and the third thickness.

In implementations where the second thickness is greater than the first thickness and the third thickness, the second thickness may be achieved by depositing a first layer and a second layer of interface material. The first thickness and the third thickness may be achieved by depositing the first layer of the interface material while omitting the second layer or by depositing the second layer of the interface material while omitting the first layer. The first thickness and the third thickness may therefore be a same or substantially equal thickness.

A transition between the second thickness and the third thickness may be positioned above a portion of a bottom electrode of the resonator. This positioning results in a termination of the bottom electrode being below an outside region of the top electrode. At a termination of the bottom electrode, a lower surface of the volume of piezoelectric material may not be smooth, which increases a likelihood of cracks or other imperfections being present in the volume of piezoelectric material. By positioning the frame region of the top electrode closer to the active region than the termination of the bottom electrode, the frame region can more effectively reduce the propagation of lateral waves.

A multi-layered top electrode may also include an upper layer comprising, for example, silicon dioxide. The upper layer may be provided in the active region as a detuning layer to improve coupling of the top electrode to the acoustic waves propagating in the volume of piezoelectric material. The upper layer may be disposed above a current-carrying layer of the top electrode to avoid insulating the interface material from the current-carrying layer. The upper layer may be formed to have a first thickness in an active region, a second thickness in a frame region, and a third thickness in the outside region. The third thickness is less than the second thickness, thus reducing a thickness (and mass-load) of the top electrode in the outside region relative to the frame region. In some implementations, the upper layer is substantially removed from the third region and the third thickness in the upper layer is therefore zero.

In the following discussion, an example environment is first described that may employ the techniques described herein. Example devices and configurations are then described, which may be implemented in the example environment as well as other environments. Consequently, example devices and configurations are not limited to the example environment, and the example environment is not limited to the example devices and configurations. Further, features described in relation to one example implementation may be combined with features described in relation to one or more other example implementations.

FIG. 1 illustrates an example environment 100, which includes a computing device 102 that communicates with a base station 104 through a wireless communication link 106 (wireless link 106). In this example, the computing device 102 is depicted as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, server, network-attached storage (NAS) device, smart appliance, vehicle-based communication system, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, cable television head-end, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102 and an uplink of other data or control information communicated from the computing device 102 to the base station 104. The wireless link 106 may be implemented using any suitable communication protocol or standard, such as 3rd Generation Partnership Project Long-Term Evolution (3GPP LTE), IEEE 802.11, IEEE 802.16, Bluetooth™, and so forth.

The computing device 102 includes a processor 108 and a computer-readable storage medium 110 (CRM 110). The processor 108 may include any type of processor, such as an application processor or multi-core processor that is configured to execute processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions, data, and other information of the computing device 102, and thus does not include transitory propagating signals or carrier waves.

A wireless transceiver 112 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 112 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment 100, the wireless transceiver 112 enables the computing device 102 to communicate with the base station 104 and networks connected therewith.

The wireless transceiver 112 includes at least one BAW resonator system 114 including at least one BAW resonator with enhanced boundary conditions for filtering signals received or transmitted via the wireless link 106. The BAW resonator system 114 may be used, for example, as an element of a duplexer for filtering during the transmitting and receiving of data and/or signals via an antenna 116. In a receiving operation, the antenna 116 receives multiple signals transmitted via one or more wireless networks, such as from the base station 104. The multiple signals can include signals having various frequencies and intended for various devices. The antenna 116 is coupled to the duplexer including the BAW resonator system 114 to perform filtering of the multiple signals. The BAW resonator system 114 may select signals within a specified passband and reject frequencies outside of the passband. The selected signals are then passed, via an output terminal of the BAW resonator system 114, to another component of the computing device 102 for further processing.

Figure 2:
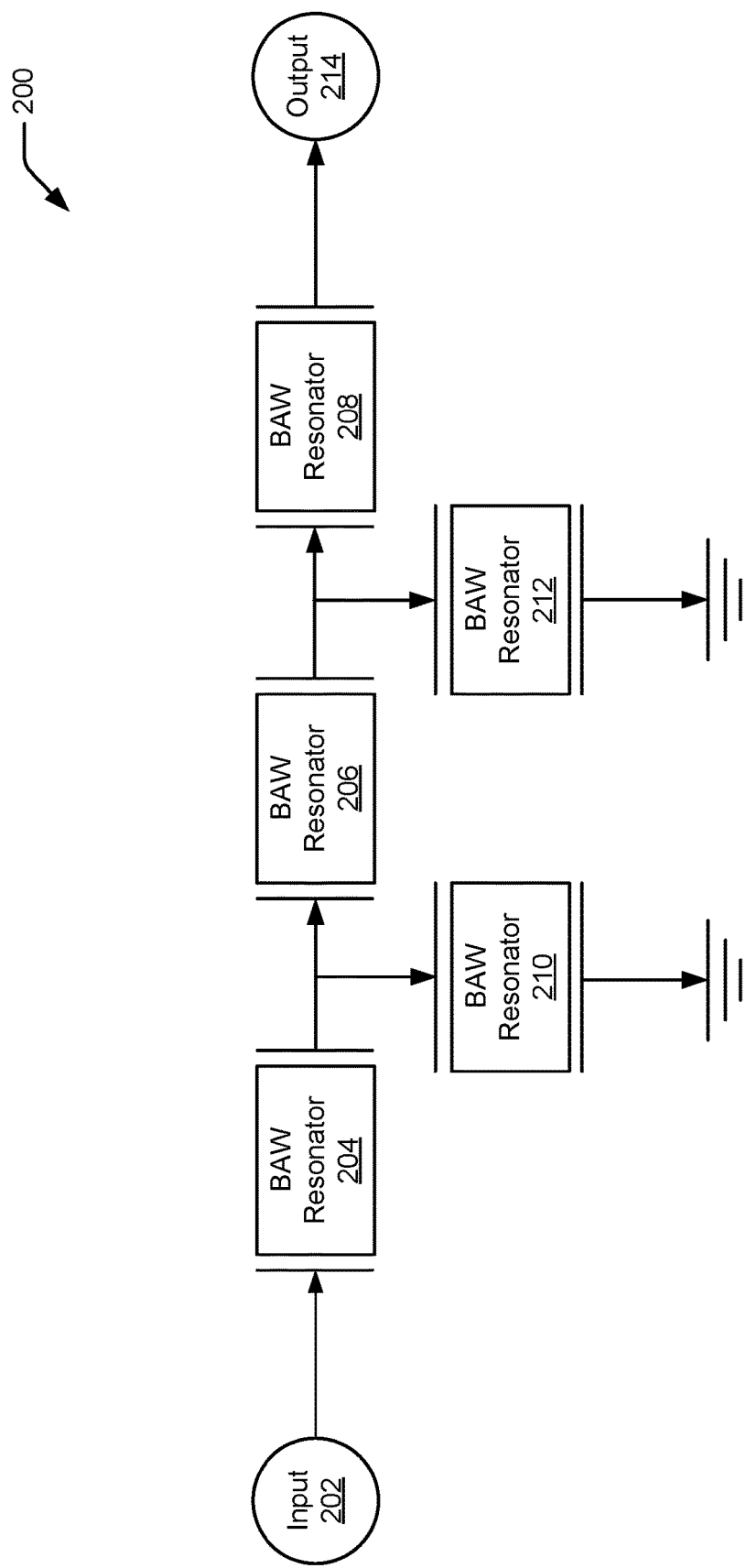
FIG. 2 is schematic view of an example ladder configuration of multiple BAW resonators.

FIG. 2 is a schematic view of an example ladder configuration 200 of the BAW resonator system 114 for filtering signals and selecting signals within a specified passband. The ladder configuration 200 includes an input terminal 202, BAW resonators 204, 206, 208, 210, and 212, and an output terminal 214.

The input terminal 202 is coupled to the BAW resonator 204 at an input electrode. The input 202 may be coupled to the antenna 116 for receiving a signal, or may be coupled to a signal generator within the computing device 102 for transmitting a signal from the computing device 102. After filtering the signal at the BAW resonator 204, an output electrode of the BAW resonator 204 is coupled in series to a BAW resonator 206 at an input electrode of the BAW resonator 206. After additional filtering of the signal at the BAW resonator 206, an output electrode of the BAW resonator 206 is coupled in series to a BAW resonator 208. After further filtering of the signal at the BAW resonator 208, an output signal is delivered to an output terminal 214. The output terminal 214 may be coupled to the antenna 116 for transmitting the output signal from the computing device 102, or may be coupled to a signal processor for further processing of the output signal.

The output electrode of the BAW resonator 204 is also coupled to an input electrode of a BAW resonator 210, which has an output electrode that is coupled to ground, for additional filtering of frequencies outside of a specified bandwidth. Similarly, the output electrode of the BAW resonator 206 is also coupled to an input electrode of a BAW resonator 212, which has an output electrode that is coupled to ground, for further filtering of frequencies outside of the specified bandwidth.

Figure 3:
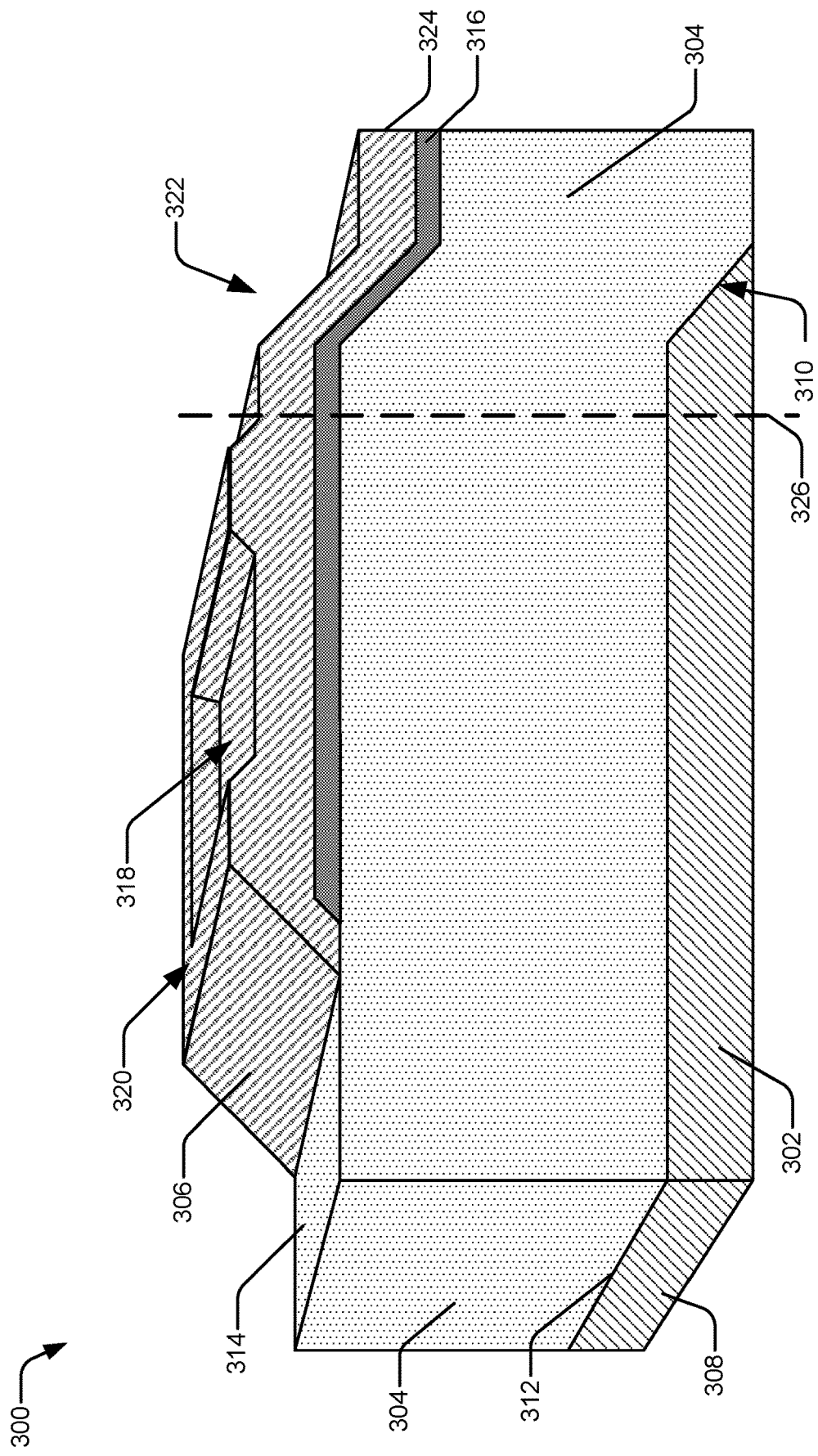
FIG. 3 is a perspective view of a cross-section of an example resonator with enhanced boundary conditions according to one or more implementations.

FIG. 3 is a perspective view of a cross-section of an example resonator 300 with enhanced boundary conditions. The resonator 300 includes a bottom electrode 302, a volume of piezoelectric material 304, and a top electrode 306. The bottom electrode 302 includes a bottom electrode feed 308 that leads to a terminal for providing input to the resonator 300 or a terminal for receiving output from the resonator 300. For example, the bottom electrode feed 308 may couple the bottom electrode 302 to the output terminal 214 or an input electrode of an adjacent BAW resonator of FIG. 2. The bottom electrode 302 also includes a bottom electrode termination 310. The bottom electrode termination 310 may be gradual as shown, or may be abrupt. At the bottom electrode termination 310, a lower surface 312 of the volume of piezoelectric material 304 is not smooth. Instead, the lower surface 312 of the volume of piezoelectric material 304 at the bottom electrode termination 310 is rotated through an angle. The rotation through an angle increases a likelihood of cracks and other imperfections in the volume of piezoelectric material 304. Further, even at a smooth bottom electrode termination 310, a change in plane of the lower surface 312 of the volume of piezoelectric material 304 can modify a topography of the lower surface 312 to increase a likelihood of cracks and other imperfections in the volume of piezoelectric material 304.

The volume of piezoelectric material 304 may include or be formed from aluminum nitride, quartz crystal, gallium orthophosphate, or a lithium-based material. Furthermore, the volume of piezoelectric material 304 may be doped, sized, and/or cut at various angles to modify propagation, coupling, or other signal attributes that arise from different material characteristics.

The top electrode 306 is disposed on an upper surface 314 of the volume of piezoelectric material. The top electrode 306 is a multi-layered electrode that may include one or more conductive layers, including an interface layer 316, and one or more non-conductive layers. The interface layer 316 may include one or more layers of high-impedance materials such as tungsten, titanium, gold, or platinum. The interface layer 316 may be positioned between a current-carrying layer of the top electrode 306 and the volume of piezoelectric material 304 to provide an acoustic interface. The top electrode 306 includes an active region 318 that is calibrated with the bottom electrode 302 to cause an active region of the volume of piezoelectric material 304 to communicate acoustic signals having a frequency within the specified bandwidth. The active region of the volume of piezoelectric material 304 is defined as a portion of the volume of piezoelectric material 304 below the active region 318 of the top electrode 306. Herein, upper surfaces of a layer or material are illustrated nearer the top of the drawing page, and lower surfaces are illustrated nearer the bottom of the drawing page. However, upper surface and lower surface terms are relative and non-limiting.

The top electrode 306 also includes a frame region 320. The frame region 320 may circumscribe the active region 318. Alternatively, the frame region 320 may border one or more edges of the active region 318, with the one or more edges including an edge separating the active region 318 from an outer region 322. The outer region 322 includes a top electrode feed 324 that leads to a terminal for providing input to the resonator 300 or a terminal for receiving output from the resonator 300. For example, the top electrode feed 324 may couple the top electrode 306 to the input terminal 202 or an output electrode of an adjacent BAW resonator of FIG. 2. The outer region 322 begins at a termination of the frame region 320 as indicated by a dashed line 326. The termination of the frame region 320 is above a portion of the bottom electrode 302 and is closer to the active region 318 than the termination 310 of the bottom electrode 302. This allows the frame region 320 to cause a reflection of lateral waves at a portion of the volume of piezoelectric material 304 that is less likely to have cracks or other imperfections as compared to a portion at or farther from the active region 318 than the termination 310 of the bottom electrode 302.

Although the active region 318 and the frame region 320 are shown having a rectangular cross-section in a plane parallel to the upper surface 314 of the volume of piezoelectric material 304, the active region 318 and the frame region 320 may be shaped in alternative shapes. For example, the active region 318 and the frame region 320 may be ellipse-shaped or polygonal-shaped. More specifically, the active region 318 and the frame region 320 may be shaped to be free of parallel edges to reduce constructive interference of reflected lateral waves.

Furthermore, the resonator 300 may include a mirror on a lower surface of the bottom electrode 302. The mirror may be realized as a Bragg mirror that includes alternating layers of a relatively high-impedance material and a relatively low-impedance material. A high-impedance material may include one or more metallic materials such as tungsten, titanium, gold, steel, or platinum. Low-impedance material may include, for example, a dielectric material such as silicone dioxide or other silicon-based material. Alternatively, the resonator 300 may include a wafer substrate defining an air gap below a lower surface of the bottom electrode 302 that is below the active region 318. For example, the resonator 300 may be implemented as a solidly-mounted resonator ("SMR") or a film bulk acoustic resonator ("FBAR").

Figure 4:
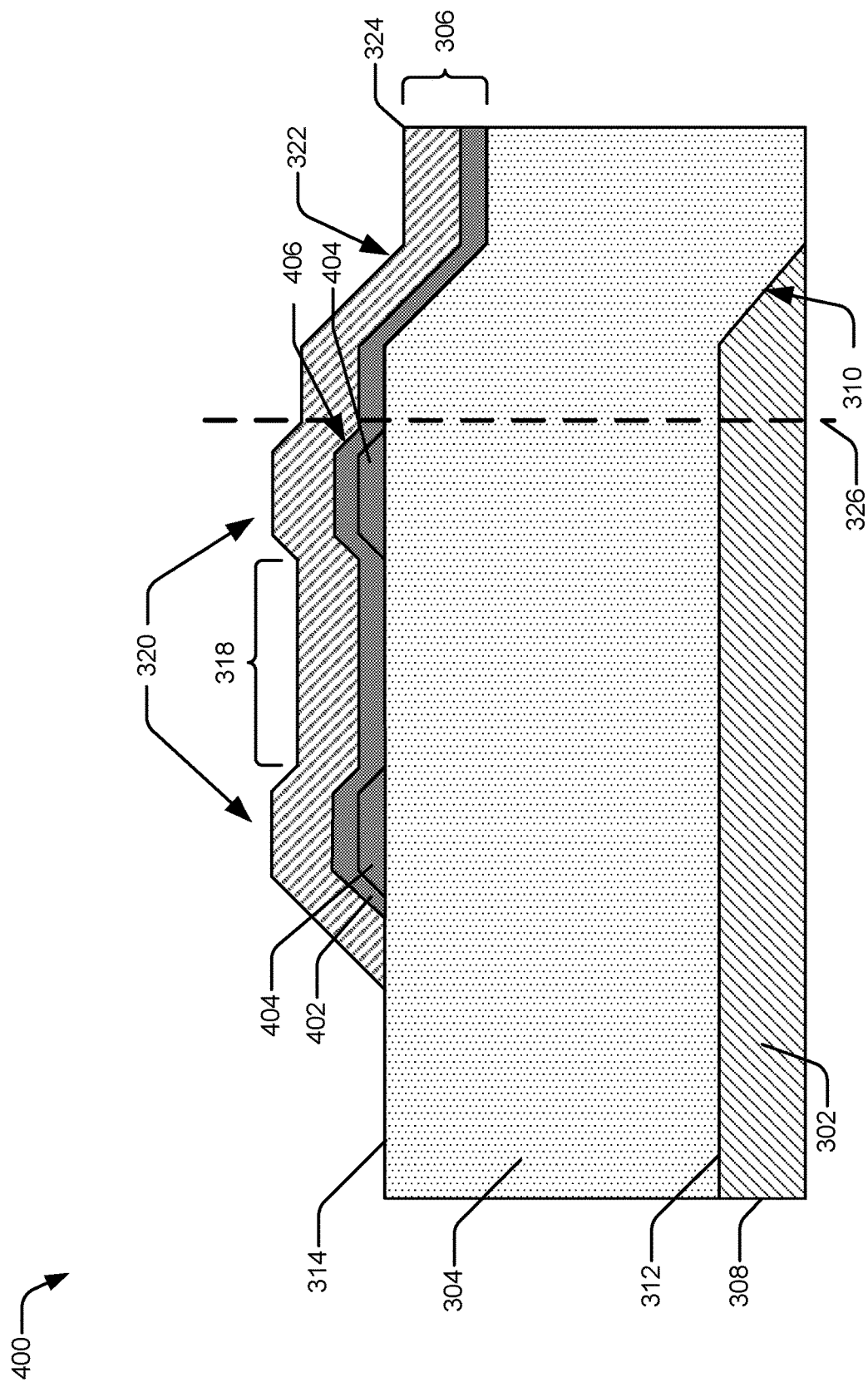
FIG. 4 is a side view of a cross-section of another example resonator with enhanced boundary conditions according to one or more implementations.

FIG. 4 is a side view of a cross-section of an example resonator 400 with enhanced boundary conditions. The resonator 400 includes the bottom electrode 302, the volume of piezoelectric material 304, and the top electrode 306 of the resonator 300 of FIG. 3. The interface layer 316 of FIG. 3 includes a first interface sub-layer 402 and a second interface sub-layer 404. The first interface sub-layer 402 extends from the frame region 320 through the active region 318 and the outer region 322 of the top electrode 306. The second interface sub-layer 404 of the interface material is disposed below the first interface sub-layer 402 in the frame region 320 to provide mass loading. The second interface sub-layer 404 may be disposed on the upper surface 314 of the volume of piezoelectric material 304 and then etched from the active region 318 and the outer region 322 of the top electrode 306. After a portion of the second interface sub-layer 404 is removed, the first interface sub-layer 402 is disposed on top of a remaining portion of the second interface sub-layer 404 and a portion of the upper surface 314 of the volume of piezoelectric material 304. Thus, in the frame region 320, a combined thickness of the first interface sub-layer 402 and the second interface sub-layer 404 is greater than their combined thickness in each of the active region 318 and the outer region 322. Additionally, the first interface sub-layer 402 may be a same thickness in the active region 318 as in the outer region 322. The interface material may include tungsten or another high-impedance material.

A transition interface 406 corresponds with a termination of the second interface sub-layer 404. The frame region 320 includes the transition interface 406 adjacent to the outer region 322 at a first distance from the active region 318. The termination 310 of the bottom electrode 302 is a second distance from the active region that is greater than the first distance (e.g., the outer region 322 overlaps a portion of the bottom electrode 302).

In some implementations, another material is deposited between the first interface sub-layer 402 and the second interface sub-layer 404. For example, another interface layer (not explicitly shown) may be deposited after the portion of the second interface sub-layer 404 is removed such that the other interface layer is deposited between the second interface sub-layer 404 and the first interface sub-layer 402. Additionally, the other interface layer may be deposited on the portion of the upper surface 314 of the volume of piezoelectric material 304 from which the second interface sub-layer 404 has been removed. The other interface layer may improve coupling of the top electrode 306 in the active region 318. The other interface layer may also facilitate adhesion between the upper surface 314 of the volume of piezoelectric material 304, or between layers of the top electrode 306. The other interface layer includes, for example, titanium, gold, or silver.

Figure 5:
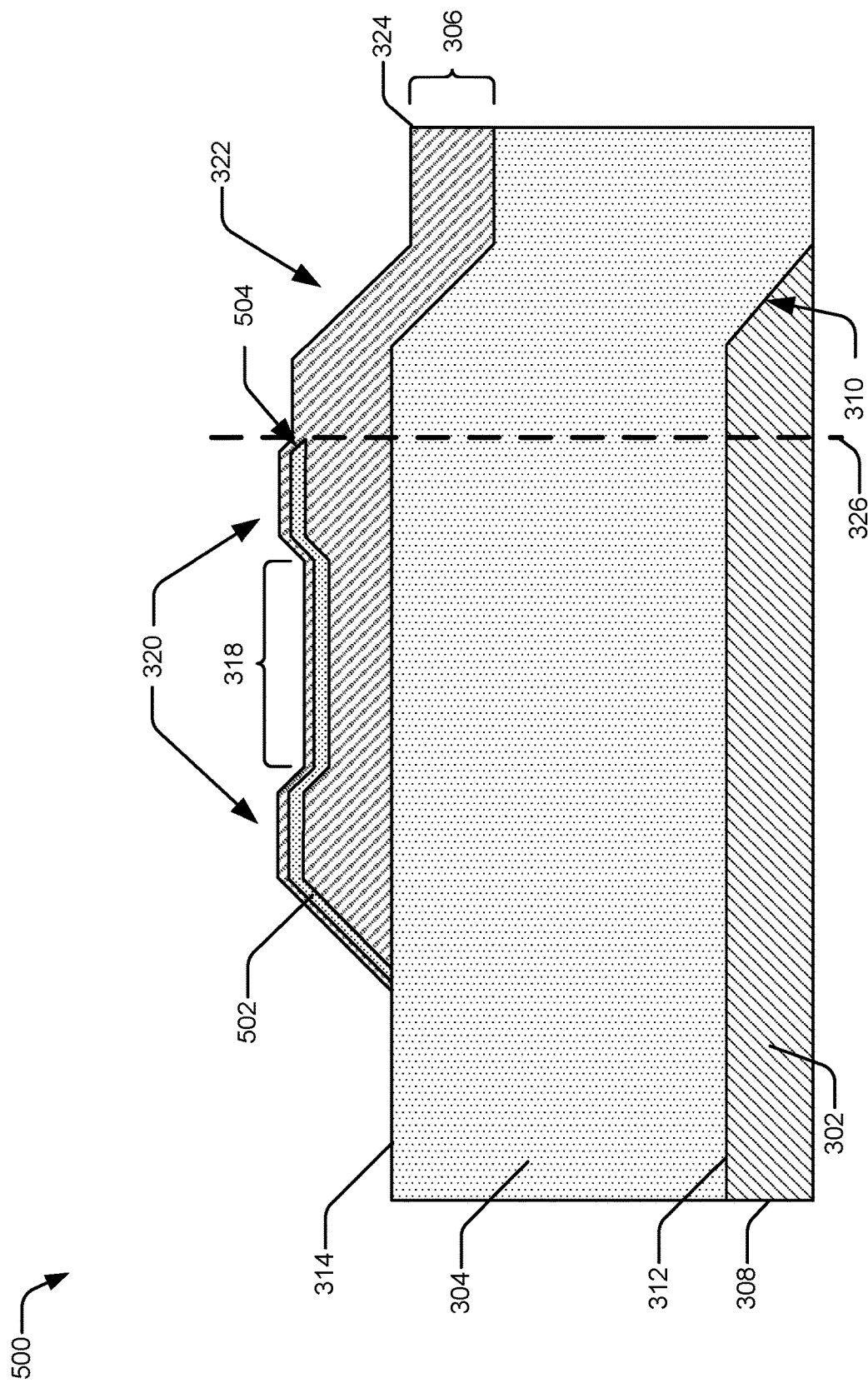
FIG. 5 is a side view of a cross-section of another example resonator with enhanced boundary conditions according to one or more implementations.

FIG. 5 is a side view of a cross-section of another example resonator 500 with enhanced boundary conditions. The resonator 500 has a top electrode 306 including an upper layer 502. The upper layer 504 of the top electrode 306 is disposed above the interface layer 316 (not shown) and/or a current carrying layer. The upper layer 504 may include an upper surface of the top electrode 306 or another layer of the top electrode 306 may be disposed between the upper layer 504 and the upper surface of the top electrode 306. One or more other layers of the top electrode 306 may be disposed between the upper layer 504 and the interface layer 316, such as a current carrying layer. In some implementations, the upper layer 504 includes a conductive material. Alternatively, the upper layer 504 includes a dielectric material, such as silicon dioxide, or another low-impedance material, which detunes and passivates the top electrode 306.

The upper layer 502 extends from a portion of the frame region 320 and the active region 318 to an upper layer transition 504. The upper layer transition 504 overlaps a portion of the bottom electrode (e.g., the upper layer transition 504 is a distance from the active region 318 that is less than a distance from the termination 310 of the bottom electrode 302 to the active region 318). The upper layer 502 has a first thickness in the active region 318 and a second thickness in the frame region 320. The first thickness of the upper layer 502 may be a same, or substantially equal, thickness as the second thickness of the upper layer 502. The upper layer 502 may extend into the outer region 322 at a third thickness or may terminate at the upper layer transition 504 (i.e., the third thickness is zero). The third thickness of the upper layer 502 is less than the second thickness of the upper layer 502.

The active region 318 and the outer region 322 each have a thickness that is less than a thickness of the frame region 320. The active region 318 may have a thickness that is less than a thickness of the outer region 322. Alternatively, the active region 318 may have a thickness that is greater than or substantially equal to a thickness of the outer region 322. In some implementations, a difference in thickness between the frame region 320 and the outer region 322 may be substantially equal to a difference in a thickness of the upper layer 502 in the frame region 320 and a thickness of the upper layer 502 in the outer region 322. For example, other layers of the top electrode 306, such as the interface layer 316 (not shown), may have a thickness that is substantially equal in the frame region 320 and the outer region 322.

As shown, the upper layer 502 extends to an end of the top electrode 306 opposite the electrode feed 324. Alternatively, the upper layer 502 may terminate at or near a maximum thickness of the frame region 320, or may overlap a length of the bottom electrode 302 along the upper surface 314 of the volume of piezoelectric material 304 (e.g., a portion of the upper surface 314 shown in the figure as left of a left-most portion of the frame region 320).

Figure 6:
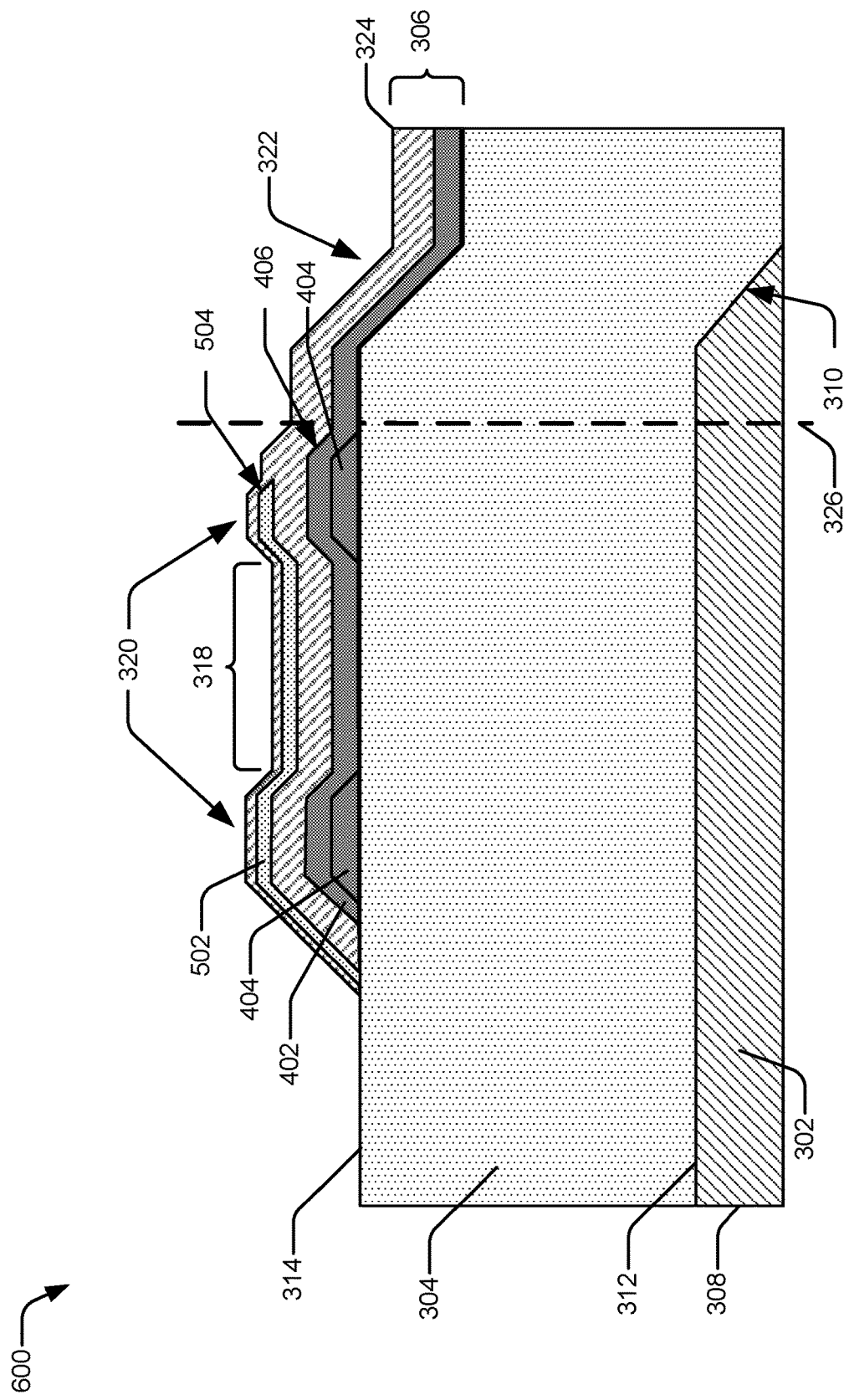
FIG. 6 is a side view of a cross-section of another example resonator with enhanced boundary conditions according to one or more implementations.

FIG. 6 is a side view of a cross-section of another example resonator 600 with enhanced boundary conditions. The resonator 600 includes a frame region 320 of the top electrode 306 that includes the interface layer 316 of FIG. 3 implemented as the first interface sub-layer 402 and the second interface sub-layer 404. The frame region 320 separates the active region 318 from the outer region 322 and may circumscribe the active region 318. The interface layer 316 is implemented without the second layer 404 in the active region 318 and without the second layer 404 in the outer region 322. Thus, the interface layer 316 has a first thickness in the active region 318, a second thickness in the frame region 320, and a third thickness in the outer region 322. The first thickness and the third thickness are less than the second thickness, and the third thickness may be a same thickness as the first thickness (or substantially equal in thickness). An interface transition 406 between the second thickness and the third thickness overlaps a portion of the bottom electrode 302 (e.g., the interface transition 406 is a distance from the active region 318 that is less than a distance from the termination 310 of the bottom electrode 302 to the active region 318).

The top electrode 306 also includes an upper layer 502 extending through the active region 318 and a portion of the frame region 320. The upper layer 502 has a first thickness in the active region 318, a second thickness in the frame region 320, and has a third thickness (shown as zero) in the outer region 322. The first thickness in the active region 318 may be a same, or substantially equal, thickness as the second thickness in the frame region 320. The third thickness in the outer region 322 is less than the second thickness in the frame region 320, and the third thickness may be zero (e.g., the upper layer 502 is removed from the outer region 322). The upper layer 502 includes an upper layer transition 504 within the frame region 320 that is a distance from the active region 318 in a direction of the electrode feed 324. The upper layer transition 504 overlaps a portion of the bottom electrode 302 (e.g., the upper layer transition 504 is a distance from the active region 318 that is less than a distance from the termination 310 of the bottom electrode 302 to the active region 318). The distance from the upper layer transition 504 to the active region 318 is less than a distance from the interface transition 406 to the active region 318.

The top electrode 306 has a first thickness in the active region, a second thickness in the frame region, and a third thickness in the outer region 322, where the second thickness is variable. The second thickness is at a maximum thickness at a distance from the active region 318 that is less than a distance from the upper layer transition 504 to the active region. The second thickness transitions to an intermediate thickness at the upper layer transition 504. The top electrode 306 then transitions to the third thickness at the interface transition 406. By staggering the interface transition 406 and the upper layer transition 504, the top electrode 306 transitions from the frame region 320 to the outer region 322 gradually, which may reduce propagation of lateral waves through the frame region 320.

Figure 7:
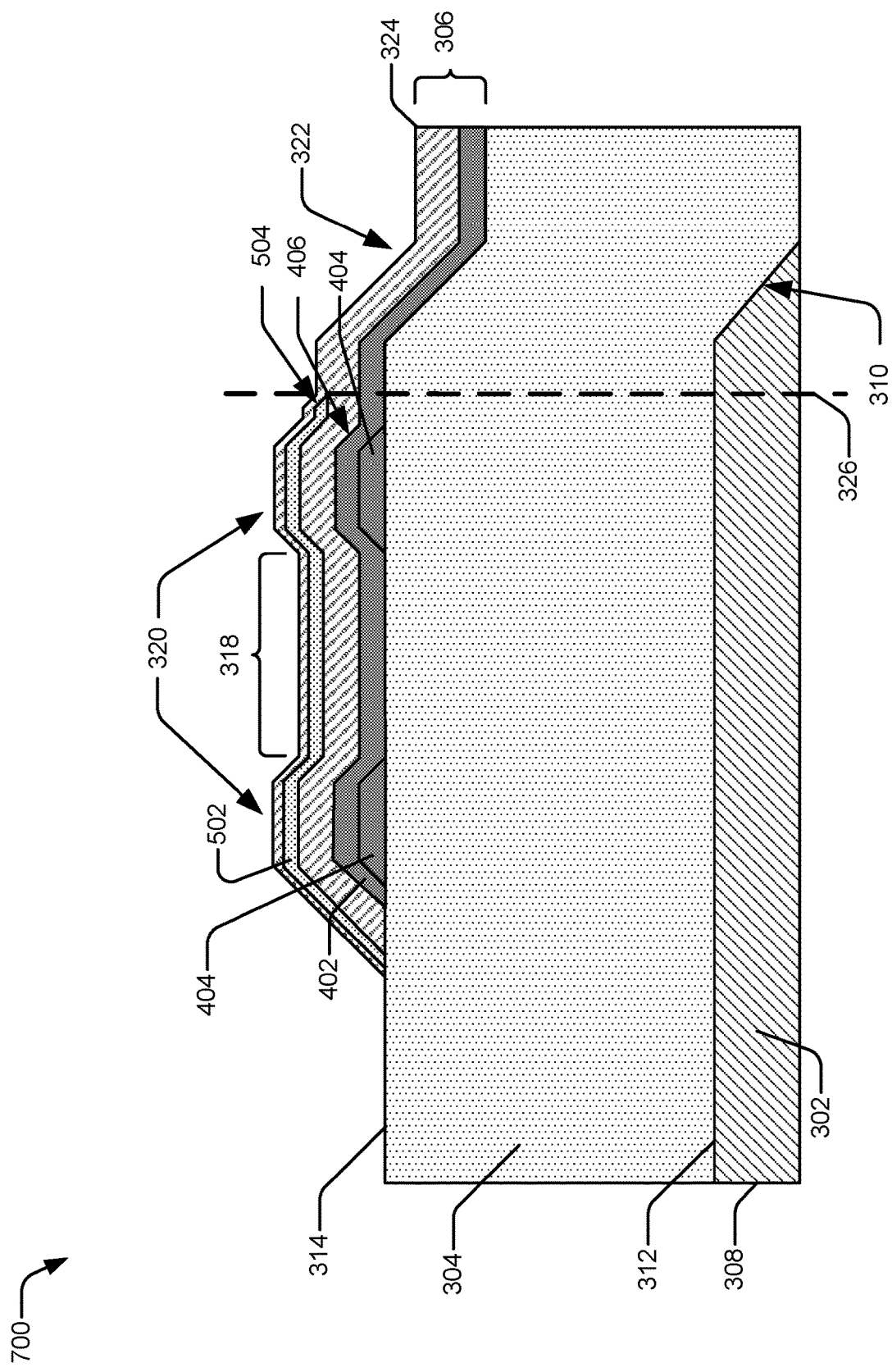
FIG. 7 is a side view of a cross-section of another example resonator with enhanced boundary conditions according to one or more implementations.

FIG. 7 is a side view of a cross-section of another example resonator 700 with enhanced boundary conditions. The resonator 700 includes a frame region 320 of the top electrode 306 that includes the interface layer 316 of FIG. 3 implemented as the first interface sub-layer 402 and the second interface sub-layer 404. The frame region 320 separates the active region 318 from the outer region 322 and may circumscribe the active region 318. The interface layer 316 is implemented without the second layer 404 in the active region 318 and without the second layer 404 in the outer region 322. Thus, the interface layer 316 has a first thickness in the active region 318, a second thickness in the frame region 320, and a third thickness in the outer region 322. The first thickness and the third thickness are less than the second thickness, and the third thickness may be a same thickness as the first thickness (or substantially equal in thickness). An interface transition 406 between the second thickness and the third thickness overlaps a portion of the bottom electrode 302 (e.g., the interface transition 406 is a distance from the active region 318 that is less than a distance from the termination 310 of the bottom electrode 302 to the active region 318).

The top electrode 306 also includes an upper layer 502 extending through the active region 318 and at least a portion of the frame region 320. The upper layer 502 has a first thickness in the active region 318, a second thickness in the frame region 320, and has a third thickness (shown as zero) in the outer region 322. The upper layer 502 includes an upper layer transition 504 within the frame region 320 that is a distance from the active region 318 in a direction of the electrode feed 324. The upper layer transition 504 overlaps a portion of the bottom electrode 302 (e.g., the upper layer transition 504 is a distance from the active region 318 that is less than a distance from the termination 310 of the bottom electrode 302 to the active region 318). The distance from the upper layer transition 504 to the active region 318 is greater than a distance from the interface transition 406 to the active region 318.

The top electrode 306 has a first thickness in the active region, a second thickness in the frame region 320, and a third thickness in the outer region 322, where the second thickness is variable. The second thickness is at a maximum thickness at a distance from the active region 318 that is less than a distance from the interface transition 406 to the active region. The second thickness of the top electrode 306 transitions to an intermediate thickness at the interface transition 406. The top electrode 306 then transitions to the third thickness at the upper layer transition 504. By staggering the interface transition 406 and the upper layer transition 504, the top electrode 306 transitions from the frame region 320 to the outer region 322 gradually, which may reduce propagation of lateral waves through the frame region 320.

Figure 8:
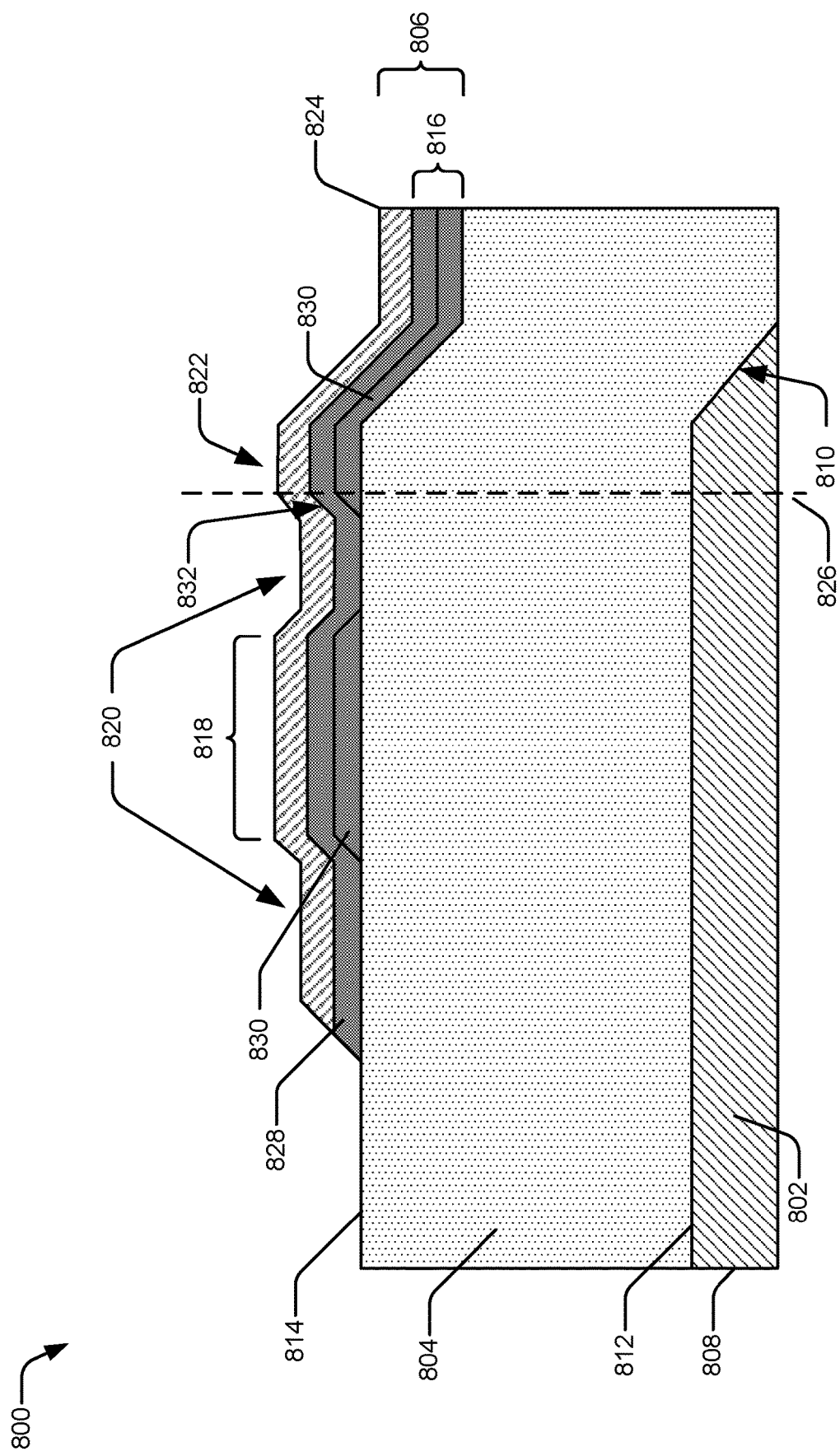
FIG. 8 is a side view of a cross-section of another example resonator with enhanced boundary conditions according to one or more implementations.

FIG. 8 is a side view of a cross-section of another example resonator 800 with enhanced boundary conditions. The resonator 800 includes a bottom electrode 802, a volume of piezoelectric material 804, and a top electrode 806. The bottom electrode 802 includes a bottom electrode feed 808 for coupling to an input signal. For example, the bottom electrode feed 808 may couple the bottom electrode 802 to the input 202 or an adjacent BAW resonator of FIG. 2. The bottom electrode 802 also includes a bottom electrode termination 810. The bottom electrode termination 810 may be gradual as shown, or may be abrupt. At the bottom electrode termination 810, a lower surface 812 of the volume of piezoelectric material 804 is not smooth. Instead, the lower surface 812 of the volume of piezoelectric material 804 at the bottom electrode termination 810 is rotated through an angle.

The top electrode 806 is disposed on an upper surface 814 of the volume of piezoelectric material. The top electrode 806 is a multi-layered electrode that may include one or more conductive layers, including an interface layer 816, and one or more non-conductive layers. The top electrode 806 includes an active region 818 that is calibrated with the bottom electrode 802 to cause an active region of the volume of piezoelectric material 804 to communicate acoustic signals having a frequency within the specified bandwidth. The active region of the volume of piezoelectric material 804 is defined as a portion of the volume of piezoelectric material 804 below the active region 818 of the top electrode 806.

The volume of piezoelectric material 804 includes a Type I dispersion piezoelectric material, such as zinc oxide. In such material, reducing propagation of lateral waves is improved by decreasing a thickness (or mass) of the top electrode 806 in a region outside of an active region 818, such as a frame region 820. The frame region 820 may fully or partially circumscribe the active region 818, or may linearly separate the active region 818 from a remaining portion of the top electrode 806. However, reducing propagation of lateral waves improves by providing a step in cutoff frequency outside of the frame region 820 in an outer region 822 that couples the active region 818 to a terminal via an electrode feed 824. The outer region 822 begins at a termination of the frame region 820 as indicated by a dashed line 826. As in other implementations discussed above, the termination of the frame region 820 is above a portion of the bottom electrode 802 and is closer to the active region 818 than the termination 810 of the bottom electrode 802.

To form the various regions 818, 820, and 822 of the top electrode 806, the interface layer 816 includes a first interface sub-layer 828 and a second interface sub-layer 830. The first interface sub-layer 828 extends across a length of the top electrode 806 including the active region 818, the frame region 820 and the outer region 822. The second interface sub-layer 830 is disposed in the active region 818 and the outer region 822. Thus, the interface layer 816 has a thickness in the frame region 820 that is less than a thickness in the active region 818 and the outer region 822. The frame region 820 includes an interface transition 832 adjacent to the outer region 822. The interface transition 832 is at a distance from the active region 818 that is less than a distance from the termination 810 of the bottom electrode 802 to the active region 818 (e.g., the outer region 822 overlaps a portion of the bottom electrode 802 that includes the termination 810).

Figure 9:
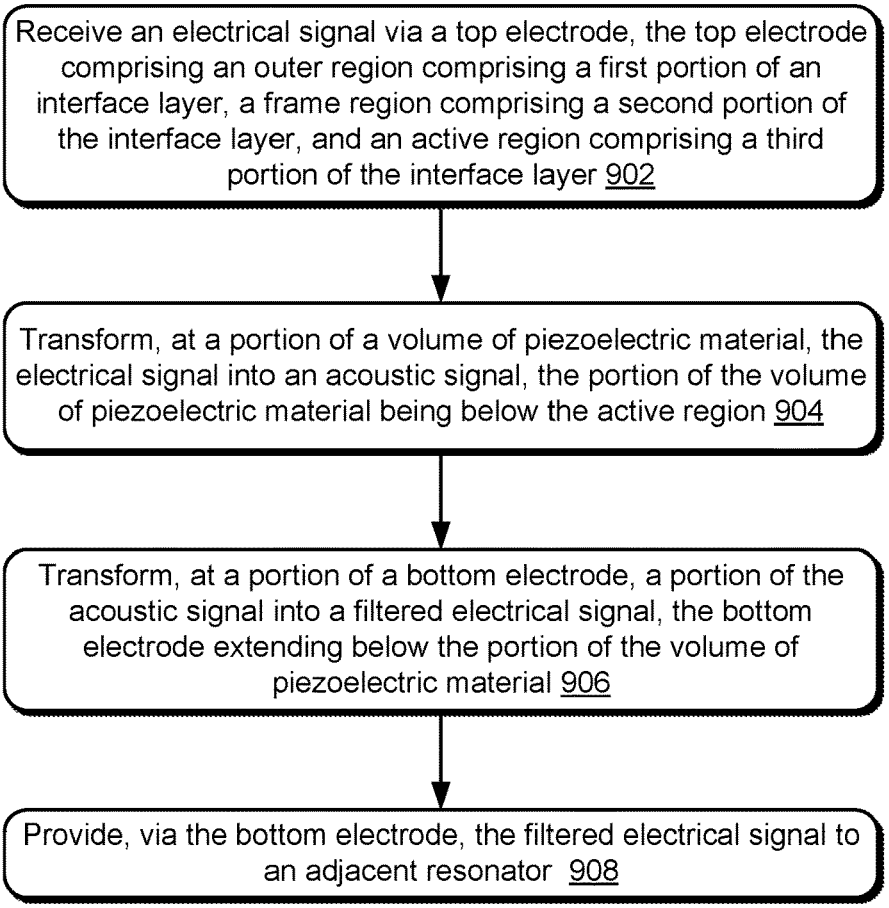
FIG. 9 is a flow diagram that depicts example operations for filtering an electrical signal using a resonator with enhanced boundary conditions according to one or more implementations.

FIG. 9 is a flow diagram 900 that describes example operations for filtering an electrical signal using a resonator with enhanced boundary conditions according to one or more implementations. At operation 902, an electrical signal is received via a top electrode. The top electrode comprises an outer region comprising a first portion of an interface layer, the first portion of the interface layer having a first thickness. The top electrode also comprises a frame region comprising a second portion of the interface layer, the second portion of the interface layer having a second thickness, the second thickness being greater than the first thickness. The top electrode further comprises an active region comprising a third portion of the interface layer, the third portion of the interface layer having a third thickness, the third thickness being less than the second thickness. For example, the top electrode 306 receives an electrical signal from a terminal via the top electrode feed 324.

At operation 904, the electrical signal is transformed into an acoustic signal at a portion of a volume of piezoelectric material. The portion of the volume of piezoelectric material is below the active region. For example, the electrical signal is transformed into an acoustic signal at a portion of the volume of piezoelectric material 304 below the active region 318. A portion of the acoustic signal propagates vertically toward the lower surface 312 of the volume of piezoelectric material 304 from the active region 318.

At operation 906, a portion of the acoustic signal is transformed into a filtered electrical signal at a portion of a bottom electrode. The bottom electrode extends below the portion of the volume of piezoelectric material. For example, the acoustic signal is transformed into a filtered electrical signal at an interface of the lower surface 312 of the volume of piezoelectric material 304 and the bottom electrode 302 below the active region 318.

At optional operation 908, the filtered electrical signal is provided to an adjacent resonator. For example, the filtered electrical signal may be output from the BAW resonator 204 to the BAW resonator 206 for further filtering.

CONCLUSION

Although example implementations of a resonator with enhanced boundary conditions have been described in language specific to structural features and/or methodological acts, it is to be understood that the implementations defined in the appended claims are not necessarily limited to the specific features or acts described. Rather, the specific features and acts are disclosed as example forms of implementing the claimed implementations.

What is claimed is:

1. A resonator comprising:
a volume of piezoelectric material comprising an upper surface and a lower surface;
a bottom electrode extending along a portion of the lower surface of the volume of piezoelectric material; and
a multi-layered top electrode extending along a portion of the upper surface of the volume of piezoelectric material, the multi-layered top electrode comprising:
an active region comprising a first portion of an interface layer, the first portion of the interface layer having a first thickness, the active region overlapping a portion of the bottom electrode;
a frame region comprising a second portion of the interface layer, the second portion of the interface layer having a second thickness, the second thickness being different from the first thickness;
an outer region comprising a third portion of the interface layer, the third portion of the interface layer having a third thickness, the third thickness being different from the second thickness;
a first interface sub-layer of the interface layer including a first interface material deposited from the frame region through the active region and the outer region; and
a second interface sub-layer of the interface layer disposed below the first interface sub-layer of the interface layer and including a second interface material deposited in the frame region.

2. The resonator of claim 1, wherein at least a portion of the frame region is disposed between the active region and the outer region.

3. The resonator of claim 1, wherein the outer region couples the multi-layered top electrode to a terminal.

4. The resonator of claim 1, wherein the frame region circumscribes the active region.

5. The resonator of claim 1, wherein the first interface material of the first interface sub-layer and the second interface material of the second interface sub-layer comprise a high-impedance material and are positioned between the volume of piezoelectric material and a current-carrying layer of the multi-layered top electrode.

6. The resonator of claim 1, wherein the third thickness is substantially equal to the first thickness.

7. The resonator of claim 1, wherein the outer region overlaps another portion of the bottom electrode.

8. The resonator of claim 1, wherein the volume of piezoelectric material comprises aluminum nitride.

9. The resonator of claim 1, wherein the first interface material of the first interface sub-layer and the second interface material of the second interface sub-layer comprise a same high-impedance material.

10. The resonator of claim 1, further comprising a mirror disposed on a lower surface of the bottom electrode, the mirror comprising alternating layers of high-impedance material and low-impedance material.

11. The resonator of claim 1, wherein the second thickness is greater than the first thickness and the third thickness.

12. The resonator of claim 1, wherein the outer region comprises a top electrode feed that couples the multi-layered top electrode to an output of an adjacent resonator.

13. A method for filtering a signal, the method comprising:
coupling the signal via a top electrode, the top electrode comprising:
an active region comprising a first portion of an interface layer, the first portion of the interface layer having a first thickness;
a frame region comprising a second portion of the interface layer, the second portion of the interface layer having a second thickness, the second thickness being greater than the first thickness;
an outer region comprising a third portion of the interface layer, the third portion of the interface layer having a third thickness, the third thickness being less than the second thickness;
a first interface sub-layer of the interface layer including a first interface material deposited from the frame region through the active region and the outer region; and
a second interface sub-layer of the interface layer disposed below the first interface sub-layer of the interface layer and including a second interface material deposited in the frame region;
transforming, at a portion of a volume of piezoelectric material and a portion of the top electrode, at least part of the signal between an electrical signal and an acoustic signal, the portion of the volume of piezoelectric material being below the active region; and
transforming, at another portion of the volume of piezoelectric material and a portion of a bottom electrode, at least part of the signal between another electrical signal and the acoustic signal, the bottom electrode extending below the other portion of the volume of piezoelectric material.

14. The method of claim 13, wherein the outer region overlaps another portion of the bottom electrode.

15. The method of claim 13, further comprising providing, via the bottom electrode, the filtered electrical signal to an adjacent filter.

16. The method of claim 13, wherein the frame region separates the active region from the outer region.

17. The method of claim 13, wherein the first thickness and the third thickness are substantially equal.

18. The method of claim 13, wherein:
the coupling comprises providing the signal from the top electrode; and
the top electrode comprises an output electrode.

19. The method of claim 13, wherein:
the coupling comprises receiving the signal at the top electrode; and
the top electrode comprises an input electrode.

* * * * *